(12) United States Patent
Takahashi et al.

(10) Patent No.: US 11,360,129 B2
(45) Date of Patent: Jun. 14, 2022

(54) MEASUREMENT APPARATUS AND METHOD

(71) Applicant: NEC Corporation, Tokyo (JP)

(72) Inventors: Shingo Takahashi, Tokyo (JP); Shigeru Koumoto, Tokyo (JP); Ryota Suzuki, Tokyo (JP); Murtuza Petladwala, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/262,518

(22) PCT Filed: Jul. 23, 2018

(86) PCT No.: PCT/JP2018/027521
§ 371 (c)(1),
(2) Date: Jan. 22, 2021

(87) PCT Pub. No.: WO2020/021600
PCT Pub. Date: Jan. 30, 2020

(65) Prior Publication Data
US 2021/0293861 A1  Sep. 23, 2021

(51) Int. Cl.
*G01R 19/25* (2006.01)
*G01R 23/16* (2006.01)

(52) U.S. Cl.
CPC ............. *G01R 19/25* (2013.01); *G01R 23/16* (2013.01)

(58) Field of Classification Search
CPC ...... G01R 19/25; G01R 23/16; G01R 21/133; G01R 25/04; G01R 19/2513

USPC .......................... 324/126, 76.11, 76.21, 76.19
See application file for complete search history.

(56) References Cited

U.S. PATENT DOCUMENTS

| | | | |
|---|---|---|---|
| 6,879,178 B1* | 4/2005 | Kantorovich | G01R 31/3012 324/762.03 |
| 8,233,974 B2* | 7/2012 | Ward | A61B 5/4878 600/547 |
| 2010/0309952 A1 | 12/2010 | Asami | |
| 2016/0077159 A1* | 3/2016 | Petrucelli | H01M 10/48 324/426 |
| 2016/0238639 A1 | 8/2016 | Tadano | |

FOREIGN PATENT DOCUMENTS

| | | |
|---|---|---|
| JP | 2004-151065 A | 5/2004 |
| JP | 2004-177389 A | 6/2004 |
| JP | 2006-050732 A | 2/2006 |
| JP | 2008-089458 A | 4/2008 |

(Continued)

OTHER PUBLICATIONS

International Search Report for PCT Application No. PCT/JP2018/027521, dated Oct. 23, 2018.

*Primary Examiner* — Giovanni Astacio-Oquendo
(74) *Attorney, Agent, or Firm* — Sughrue Mion, PLLC

(57) ABSTRACT

Provided a method including applying a Fourier Transform to an AC current waveform measured to perform conversion thereof to a frequency domain; adjusting entire phase components of frequency spectra obtained as a result of the Fourier Transform, such that a phase component of an AC power supply frequency becomes zero; and applying an inverse Fourier Transform to the frequency spectra with the entire phase components thereof adjusted to obtain a current waveform in a time domain.

15 Claims, 13 Drawing Sheets

(56) References Cited

FOREIGN PATENT DOCUMENTS

| | | | |
|---|---|---|---|
| JP | 2010-096635 | A | 4/2010 |
| JP | 2014-217215 | A | 11/2014 |
| JP | 2015-010849 | A | 1/2015 |
| JP | 2016-033488 | A | 3/2016 |
| WO | 2015/063943 | A1 | 5/2015 |
| WO | 2015/159364 | A1 | 10/2015 |

* cited by examiner

FIG. 10
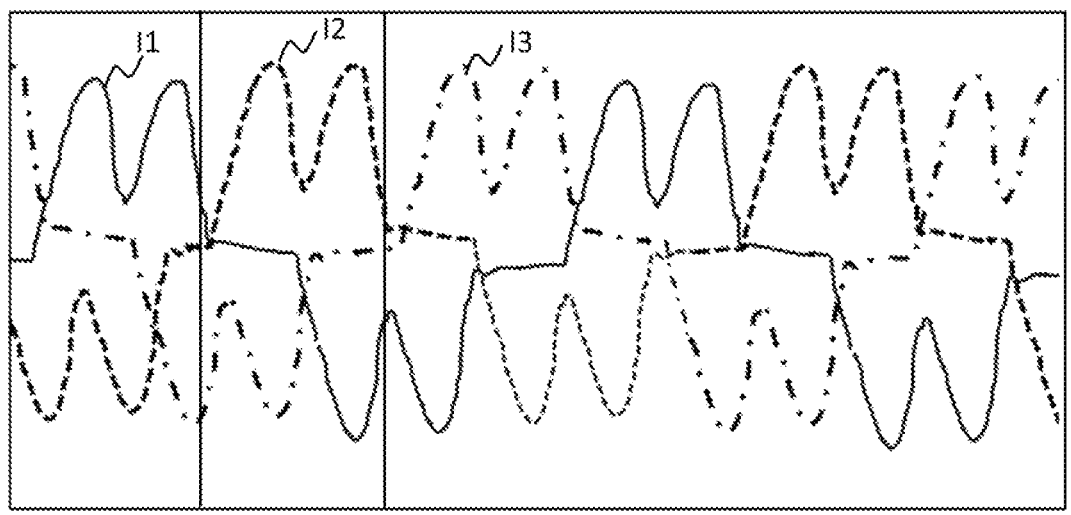
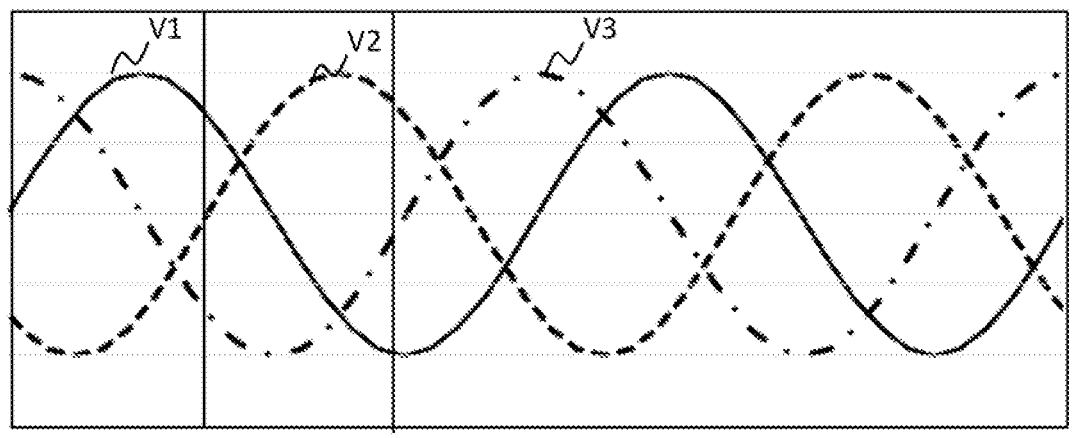

MEASUREMENT APPARATUS AND METHOD

This application is a National Stage Entry of PCT/JP2018/027521 filed on Jul. 23, 2018, the contents of all of which are incorporated herein by reference, in their entirety.

FIELD

The present invention relates to a measurement apparatus and a method.

BACKGROUND

A technology is used that monitors a power consumption and a consumption current waveform using a sensor(s) installed in a distribution board to estimates, on based on a feature value(s) thereof or the like, a power consumption and an operating state of an individual electrical apparatus with a power supplied from the distribution board. Time-series based comparison and analysis for a current waveform requires measurement of the current waveform based on a phase of a voltage. It is preferable in measurement of a current waveform to accurately grasp a phase delay of a current waveform with respect to a voltage waveform. It is known that inaccuracy of a phase delay with respect to a voltage waveform results in an increase in calculation cost in estimation of a current waveform, and furthermore a decrease in accuracy of the estimation and inability to be made practical.

Hence, as illustrated in FIG. 12, it is desirable to simultaneously measure current and voltage. FIG. 12 schematically illustrates an example of a power measurement system in a three-phase four-wire connection. A current waveform and a voltage waveform are monitored respectively by an ammeter 101 and a voltmeter 102 installed in a breaker 105 of a distribution board that supplies power to a load 104 such as an electrical equipment. In general, a non-contact type sensor such as CT (Current Transformer) is used as the ammeter 101. In a CT, an Alternating-Current (AC) current (secondary current) flows through a secondary winding according to a winding ratio thereof to cancel a magnetic flux generated in a magnetic core by an AC current flowing through, for example, a conductor (primary side). A voltage between both ends of a resistor generated by the secondary current (which is proportional to a current flowing through the conductor) is measured. The ammeter 101 may be connected to a main trunk of a distribution board in place of a branch wiring. FIG. 13 is a diagram illustrating an example of three-phase four-wire system current waveforms I1, I2 and I3, and voltage waveforms V1, V2 and V3 to a load 104 measured by the ammeters 101 and the voltmeters 102.

As illustrated in the example of FIG. 12, in measurement of a line voltage by the voltmeter 102, it is difficult to perform the measurement without touching a power wiring, i.e., with no contact, and in high accuracy. Installation of a voltage measurement cable requires construction by a qualified electrician. Voltage information can be obtained by measuring a voltage of a wiring network, but it is generally often the case that no power outlet is provided in a distribution board. Hence, a new construction for performing measurement by a voltmeter becomes necessary.

For a problem of installation of a voltage sensor in a distribution board, a method to obtain a current waveform in synchronization with a voltage waveform by a non-contact type voltage/current sensor using a stray capacitance arising between an electric wire and a sensor is known (Patent Literature (PTL) 1).

PTL 1 discloses that, although it is possible to measure a current waveform in synchronization with a voltage waveform, a value of a stray capacitance varies depending on thickness or material of an electric wire or furthermore how it is attached, and although a value of a phase delay becomes constant after the sensor has been installed, a value thereof varies depending on an installation environment. Furthermore, PTL 1 discloses that there is a problem that since a phase delay between a current waveform and a voltage waveform is environment-dependent, it is difficult to know it just from a non-contact measurement result. To cope with this problem, PTL 1 discloses a phase delay between current and voltage estimation apparatus and a method, each estimating a phase delay between a voltage waveform and a current waveform by using a non-contact type voltage/current sensor. In PTL 1, a power factor between a measured current waveform and a voltage waveform having a phase delay is calculated, and a phase delay at which the power factor becomes maximum is estimated to be a true value. As described above, in PTL 1, a non-contact type voltage sensor and current sensor respectively measure a voltage waveform and a current waveform to estimate a phase delay therebetween.

PTL 1: Japanese Patent Kokai Publication No. JP2016-033488A

SUMMARY

Time-series based comparison and analysis for a current waveform requires measurement of the current waveform based on a voltage phase.

As described above, in order to perform voltage measurement in a distribution board, construction for installing a voltage measurement cable(s) conducted by a qualified person (electric construction) is required.

Furthermore, since there is often the case that no power outlet is provided in a distribution board, a new construction thereof becomes necessary.

The present invention has been made in view of the above issues and it is an object of the present invention to provide an apparatus and method, each enabling an analysis of a measured current without voltage measurement.

According to a mode of the present invention, there is provided a measurement apparatus including a first operation part that applies a Fourier Transform to a measured Alternating-Current (AC) current waveform to perform conversion thereof to a frequency domain; a phase adjustment part that adjusts entire phase components of frequency spectra obtained as a result of the Fourier Transform, such that a phase component of an AC power supply frequency becomes zero; and a second operation part that applies an inverse Fourier Transform to the frequency spectra with the entire phase components thereof adjusted to obtain a current waveform in a time domain.

According to a present invention, there is provided a measurement method including:

applying a Fourier Transform to an AC current waveform measured to perform conversion thereof to a frequency domain;

adjusting entire phase components of frequency spectra obtained as a result of the Fourier Transform, such that a phase component of an AC power supply frequency becomes zero; and applying an inverse Fourier Transform to the frequency spectra with the entire phase components thereof adjusted to obtain a current waveform in a time domain.

The present invention makes it possible to analyze a current measured without voltage measurement.

BRIEF DESCRIPTION OF DRAWINGS

FIG. 10 is a diagram illustrating outputs of the measurement apparatus.

DETAILED DESCRIPTION OF EMBODIMENTS

Example embodiments of the present invention will be described with reference to drawings.

Example Embodiment 1

Figure 1:
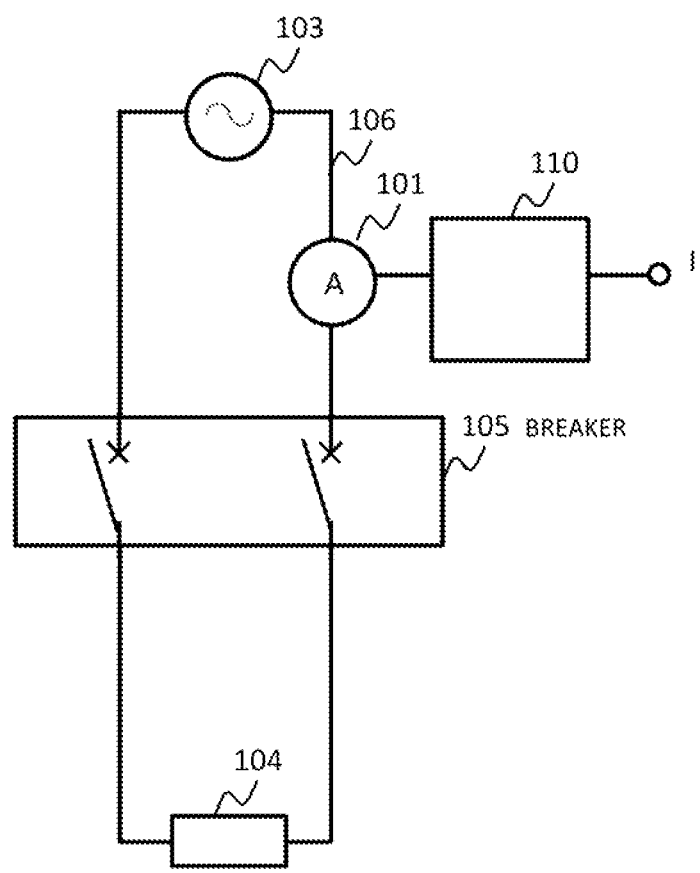
FIG. 1 is a diagram illustrating an example embodiment 1 of the present invention.
Figure 2:
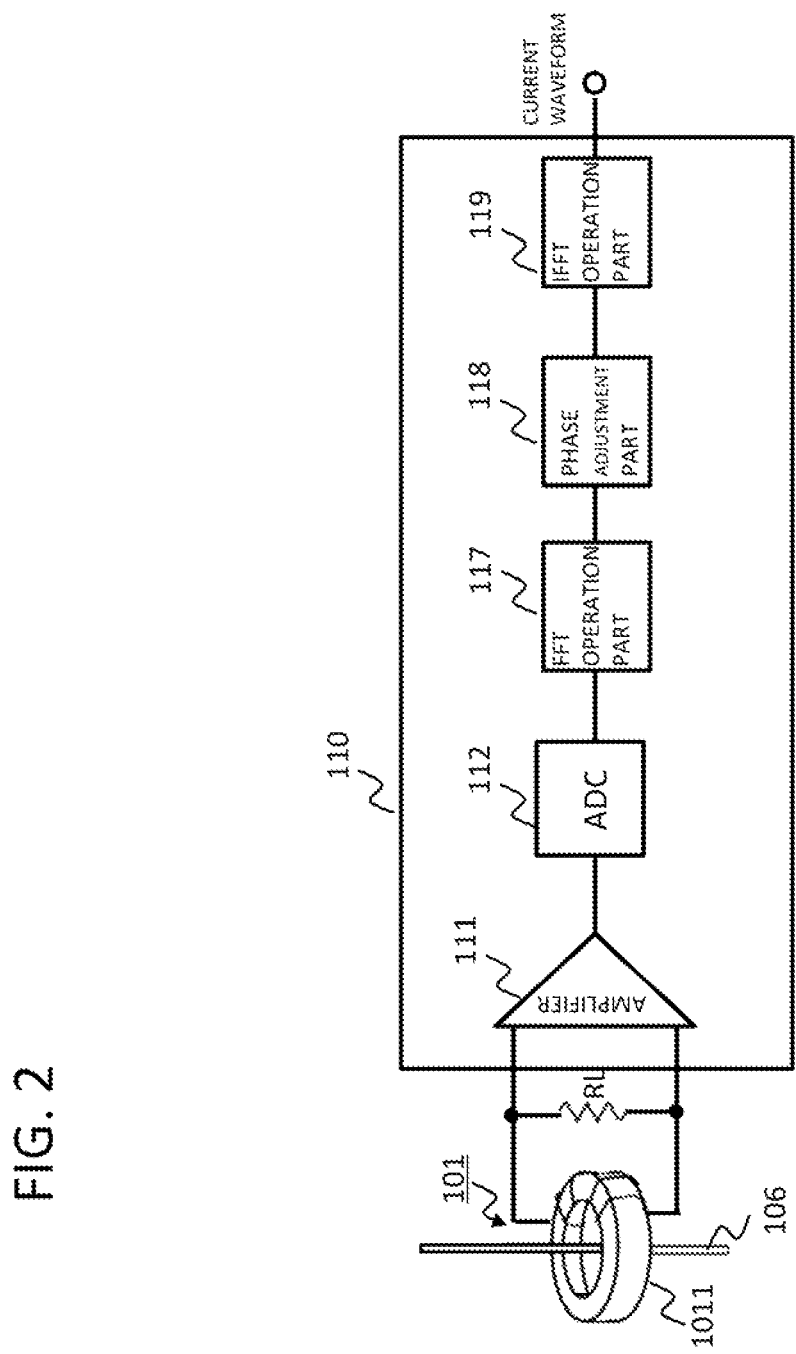
FIG. 2 is a diagram illustrating the example embodiment 1 of the present invention.

FIG. 1 is a diagram illustrating an arrangement of an example embodiment 1 of the present invention. In FIG. 1, an example of a single-phase two-wire connection is illustrated for ease of explanation. A non-contact type ammeter 101 such as a Current Transformer (CT), for example, detects an Alternating-Current (AC) current flowing through a power supply line 106 from an Alternating-Current (AC) power supply 103 and provides, to a measurement apparatus 110, the AC current, for example, as a voltage between terminals of a resistor. In FIG. 1, the ammeter 101 performs contactless detection of a current flowing through the power supply line 106 of a breaker 105 in a distribution board. The measurement apparatus 110 applies Fourie Transform to a current waveform acquired by the ammeter 101 to convert the current waveform to a frequency domain. Then, the measurement apparatus 110 adjusts entire phase components of frequency spectra such that a phase of an AC power supply frequency component becomes 0 (zero), and then applies inverse Fourie-transform to the frequency spectra having the entire phase components thereof adjusted to obtain a current waveform in a time domain. Note that hereinafter a Fast Fourie Transform (FFT) is used as a Fourie Transform, but a Discrete Fourie Transform (DFT) may also be used FIG. 2 is a diagram illustrating an arrangement of the example embodiment 1. Referring to FIG. 2, in an ammeter 101, an AC current (secondary current) according to a turn ratio of a secondary winding flows through the secondary winding to cancel a magnetic flux that is generated in a magnetic core 1011 by an AC current flowing through the power supply line 106 (primary side), and a voltage between both ends of a resistor RL generated by the secondary current is outputted as a value of a detected current. In a measurement apparatus 110, an amplifier 111 performs voltage-amplification of a voltage (AC voltage) between terminals of the resistor RL. An analog-to-digital converter (ADC) 112 converts a voltage from the amplifier 111 to a digital signal. The FFT operation part 117 performs an FFT operation on a digital signal sequence x(0), x(T), x(2T), and x((N−1)T) (where T is a sampling period, and N is the number of sampling points). A sampling frequency Fs is given as Fs=1/T.

Let the number of points of FFT be N, a result of an FFT operation (Fourie coefficient): $X(\omega_k)$: where $\omega_k=2\pi k/(N\times T)$ (k=0, ..., N−1) of a digital signal sequence x(nT), (n=0, ..., N−1) is represented by X(k). When X(k) is represented in a format where a real part and an imaginary part thereof are separated:

$$X(k)=R(k)+jI(k) \quad (1)$$

(where $j^2=-1$)
a phase component is given as below:

$$\varphi(k) = \tan^{-1}\left(\frac{I(k)}{R(k)}\right) \quad (2)$$

An amplitude component (gain) is given as below:

$$p(k)=\|X(k)\|=\sqrt{R(k)^2+I(k)^2} \quad (3)$$

A phase adjustment part 118 performs an operation of each frequency component such that, with respect to phase components of the frequency spectra, a phase component of an AC power supply frequency ($f_0$=50 Hz/60 Hz) becomes 0 (zero).

More specifically, as for phase components of the AC power supply frequency ($f_0$=50 Hz/60 Hz) and phase components of harmonic components of the AC power supply frequency ($f_0$=50 Hz/60 Hz), the following calculation is performed:

$$\varphi(i\times f_0)=\varphi(i\times f_0)-\varphi(f_0) \quad (4)$$

(i=1, ..., M, where $M\times f_0 \le$ Nyquist frequency=Fs/2)

Here, let the AC power supply frequency $f_0$ be q times of 1/N of the sampling frequency Fs ($f_0=q\times Fs/N$), $\varphi(i\times f_0)$ in Expression (4) corresponds to a phase component of coefficient $X(\omega_i)$: where $\omega_i=2\pi q\times i/(N\times T)$ (i=1, ..., M, where $M\le q/2$).

An IFFT operation part 119 performs an IFFT operation on frequency spectra having phase components of the AC power supply frequency ($f_0$) and harmonic components thereof adjusted:

$$X(k)=p(k)\cos(\varphi(k))+jp(k)\sin(\varphi(k)) \quad (5)$$

(k=0, ..., N−1),
to put the frequency spectra back to a waveform in time domain (time-series data).

Figure 3A:
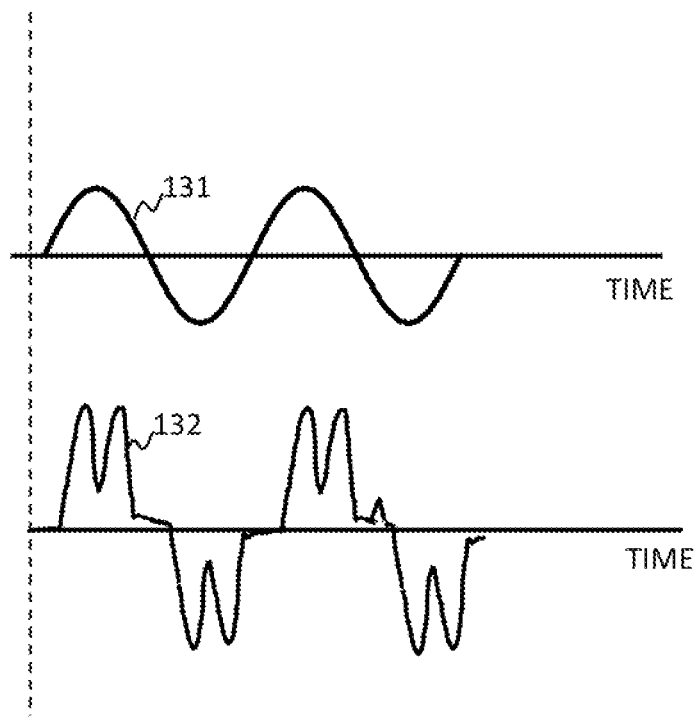
FIGS. 3A, 3B and 3C are diagrams illustrating the example embodiment 1 of the present invention.
Figure 3B:
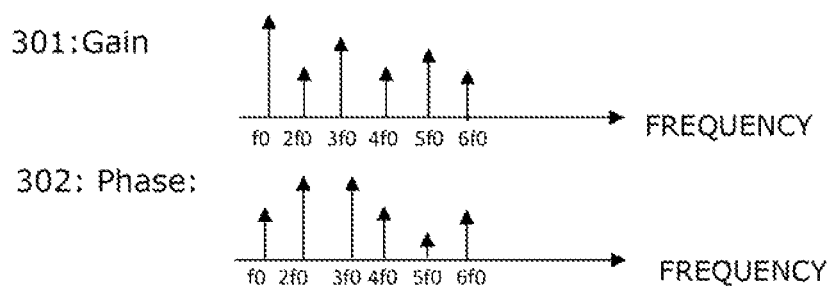
Figure 3C:
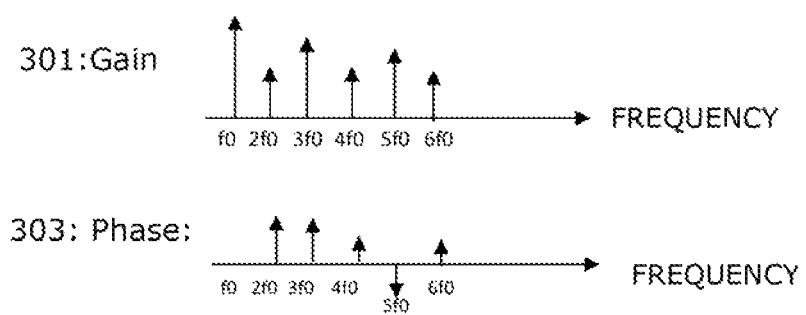

FIGS. 3A to 3C are diagrams illustrating the example embodiment 1. In FIG. 3A, it is assumed that a waveform 131 is an AC voltage waveform provided from the AC power supply 103 to the distribution board. A waveform 132 is a current waveform measured by the ammeter 101.

Gain 301 and Phase 302 illustrated in FIG. 3B schematically illustrate a result of an IFFT operation of the waveform 132 (the gains are given by Expression (3) and the phases are given by Expression (2)).

The gain 301 illustrated in FIG. 3C are the same as the gain 301 illustrated in FIG. 3B. The phase 303 illustrated in FIG. 3C schematically illustrate a result of adjusting whole phases in such a manner that phases of frequency components of the AC power supply become 0 (zero) with respect to the phase 302 illustrated in FIG. 3B. In FIG. 3C, operations of phases of the above Expression (4) are illustrated with respect to harmonic frequency components of the AC power supply frequency $f_0$, the operations of phases of the above Expression (4) may be performed with respect to frequencies other than the harmonic components of the AC power supply frequency depending on a sampling frequency. That is, with respect to phase component of each of frequency spectra less than or equal to Nyquist frequency (=Fs/2), phase components may be obtained as values by subtracting the phase components of the AC power supply frequency $f_0$.

According to the example embodiment 1, it becomes possible to set a phase of an AC current to a known value (for example 0 (zero)), by level-shifting whole phase components in a frequency domain from a current waveform in such a manner that a phase of the AC power supply frequency component is a known value. The FFT operation part 117, the phase adjustment part 118 and the IFFT operation part 119 may be implemented by a processor such as a Digital Signal Processor (DSP). According to the example embodiment 1, the measurement apparatus 110 is configured as a battery driven apparatus.

It is possible to adopt a configuration that generate an AC voltage to maximize a power factor for an AC current waveform obtained by performing an IFFT operation to frequency spectra having phase components in an entire frequency domain adjusted based on a phase component of the AC power supply frequency component.

The present example embodiment makes it possible to analyze a current waveform measured without voltage measuring and to measure a current at a timing in synchronization with an AC voltage. The example embodiment enabling measurement of a current at a timing in synchronization with an AC voltage is not limited to that described above, but a technique as described below may be adopted.

Example Embodiment 2

Figure 4A:
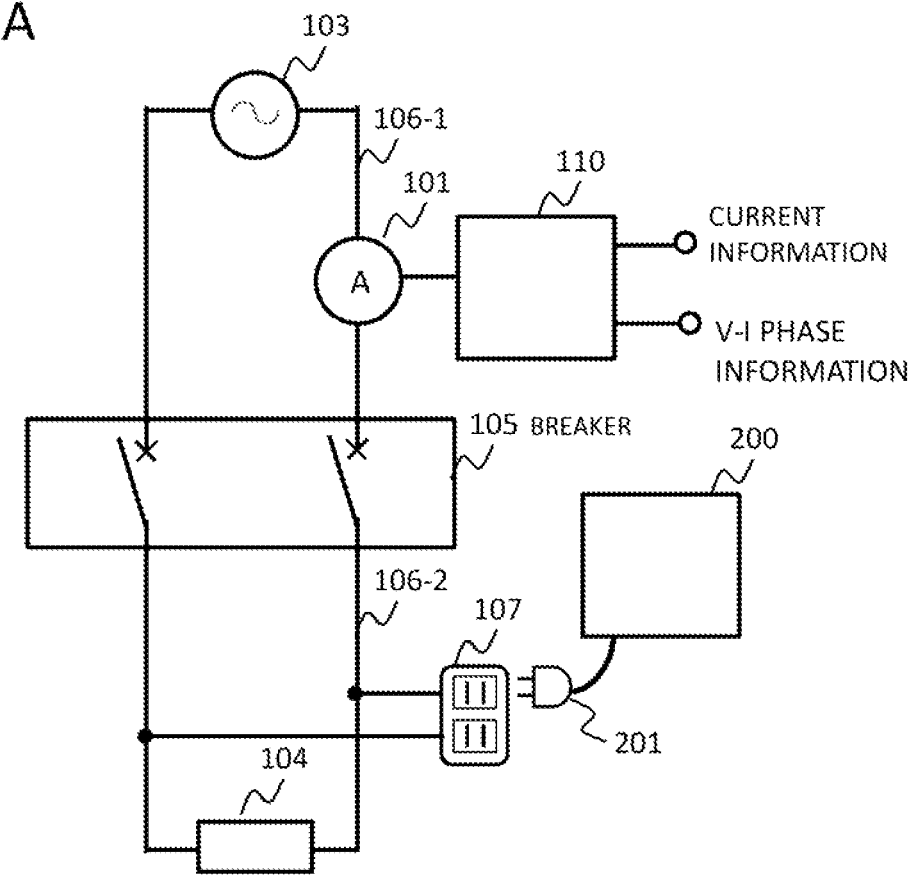
FIGS. 4A and 4B are diagrams illustrating example embodiments 2 and 3 of the present invention.

FIG. 4 is a diagram illustrating an example embodiment 2 of the present invention. In FIG. 4A, to facilitate an explanation, an example of a single-phase two-wire connection is illustrated. Referring to FIG. 4A, a non-contact type ammeter 101 such as a Current Transformer (CT), for example, detects an AC current flowing through a power supply line from an AC power supply 103 and provides the AC current to a measurement apparatus 110, for example, as a voltage between terminals of a resistor. In FIG. 4A, the ammeter 101 performs non-contact detection of a current flowing through the power supply line 106-1 in a breaker 105 of a distribution board.

Figure 4B:
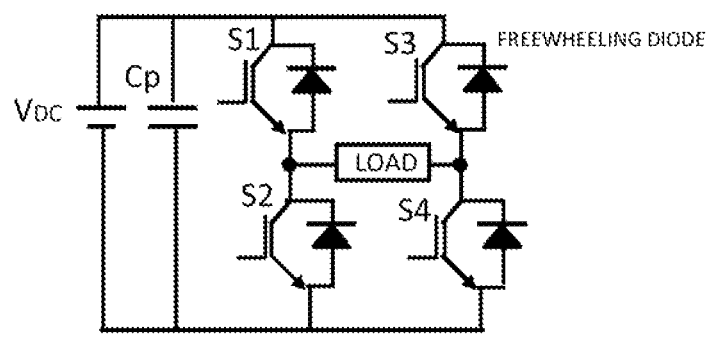

An apparatus (device) 200 with a consumption current characteristic having a predetermined pattern occurring in synchronization with a current frequency is connected to a power outlet 107 that is connected to a power supply line 106-2 downstream of a breaker 105. That is, a power plug 201 of the device 200 is connected (inserted) to the power outlet 107, thereby connected to the power supply line 106-2.

w, the device 200 may be configured by such as an inverter as illustrated in FIG. 4B. In FIG. 4B, switching elements S1-S4 may be Insulated Gate Bipolar Transistors (IGBTs) or Metal-Oxide-Semiconductor Field Effect Transistors (MOSFETs). A load element is connected at a connection point of the switching elements S1 and S2 and a connection point of the switching elements S3 and S4. When the switching elements S1 and S4 are turned on at the same time, the switching elements S2 and S3 are turned off and a current flows through in a direction from a DC power supply (VDc) to the switching element S1, the load and the switching element S4, and when the switching elements S2 and S3 are turned on at the same time, the switching elements S1 and S4 are turned off and a current flows through in a direction from the DC power supply (VDc) to the switching element S3, the load and the switching element S2. In FIG. 4B, an AC (Alternate Current)-DC (Direct Current) converter or the like which converts an AC power supply to a DC Power supply (VDc) is omitted. As a non-limiting example, the device 200 may be configured by a self-excited converter (inverter), an inductor element(s) and a capacitor element(s), or the like having no consumption of reactive power. The device 200 may be configured to synchronize with a power supply frequency (50 Hz (Hertz)/60 Hz) of the AC power supply 103, accumulate a power at a predetermined timing and release the accumulated power at a different timing for return to the AC power supply 103. As a current pattern of the device 200, the closer a power factor of the pattern is to 0 (zero), the more a power consumption can be suppressed.

Figure 5:
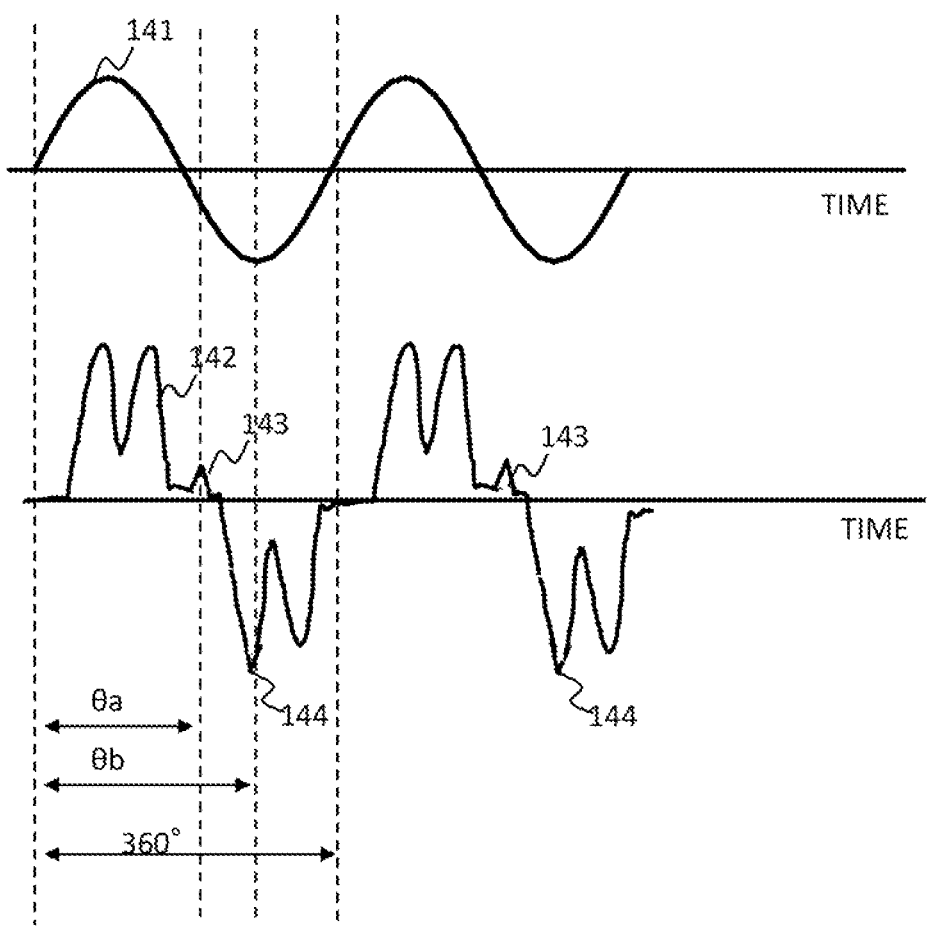
FIG. 5 is a diagram illustrating the example embodiment 2 of the present invention.

FIG. 5 is a diagram illustrating an operation of the example embodiment 2. In FIG. 5, a waveform 141 is an AC voltage waveform supplied to the distribution board from the power supply 103. The waveform 142 is a current waveform measured by the ammeter 101. Reference numbers 143 and 144 designate a current pattern of a predetermined shape at the device 200 appearing at a timing synchronized with the AC voltage waveform 141. In the example embodiment 2, the current patterns 143 and 144 appear at phases θa and θb from a starting point of an AC voltage cycle. Although a current waveform pattern consumed in synchronization with a phase of a voltage by the device 200 is arbitrary such as a sine wave, a rectangular wave, a triangular wave, or the like, the current waveform pattern is preferably an isolated pattern which can be discriminated when superimposed on a consumption current of the load 104. A current pattern unique to the device 200 may have a configuration in which at least one pattern is arranged per cycle of the AC power supply period.

The measurement apparatus 110 detects a current pattern of the device 200 from a current at the distribution board measured by the ammeter 101 and calculates phase information (lead to a current) of an AC voltage at the distribution board (breaker 105) from the current pattern. A phase difference between the AC voltage at the power outlet 107 and the AC voltage at the distribution board in FIG. 4A is assumed to 0 (zero).

Figure 6:
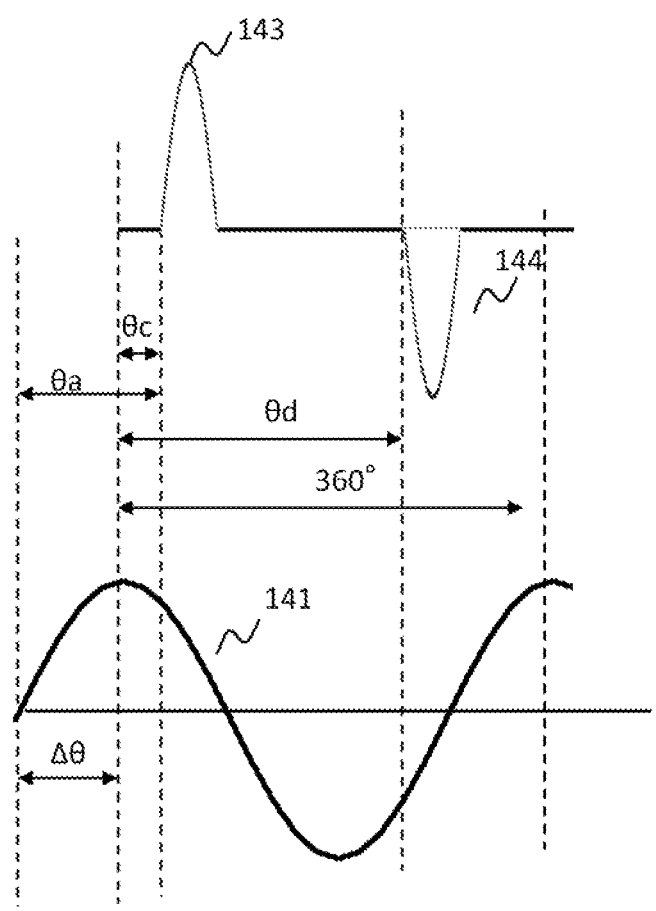
FIG. 6 is a diagram illustrating the example embodiment 2 of the present invention.

In FIG. 5, it is assumed that the current patterns 143 and 144 are in phase-synchronization with the AC voltage. The current patterns 143 and 144 are periodic. Hence, it is possible to estimate an AC voltage waveform at the distribution board by detecting occurrence positions of the current patterns 143 and 144. For example, as illustrated in FIG. 6, when an occurrence position (phase) of a measured current pattern 143 is θc, it is possible to estimate a phase difference between an AC voltage waveform and an AC current waveform at the distribution board based on a difference (θa−θc) from an original phase θa of the current pattern 143 from a starting point of an AC cycle.

Figure 7:
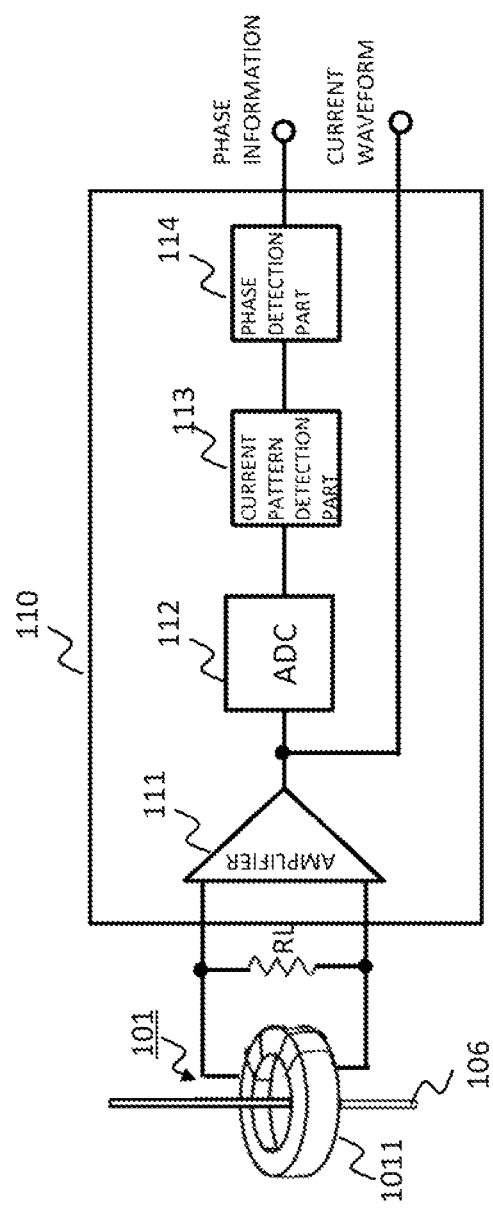
FIG. 7 is a diagram illustrating an arrangement of a measurement apparatus of the example embodiment 2 of the present invention.

FIG. 7 is a diagram illustrating an arrangement of the example embodiment 2. In an ammeter 101, an AC current (secondary current) according to a turn ratio of secondary windings flows through a secondary winding to cancel a magnetic flux generated in a magnetic core 1011 by an AC current which flowing through the power supply line 106 (primary side), and a voltage between both ends of a resistor RL generated by the secondary current is outputted as a value of a detected current. In a measurement apparatus 110, an amplifier 111 performs voltage-amplification of a voltage (AC voltage) between terminals of the resistor RL. An analog-to-digital converter (ADC) 112 converts a voltage from the amplifier 111 to a digital signal.

The current pattern detection part 113 analyzes the digital signal from the ADC 112, detects a current pattern unique to the device 200 to obtain timing information of the pattern. That is, the current pattern detection part 113 calculates a position of a current waveform of a current pattern unique to the device 200 in one cycle (360 degree). A delay (phase) of the current pattern unique to the device 200 from a zero-cross point of an AC voltage waveform is assumed to be known (the delay may be measured in advance and stored in the measurement apparatus 110).

A phase detection part 114 estimates a phase difference between a current waveform and AC voltage waveform in the distribution board, based on a detection position of the current pattern 143 (144) unique to the device 200. That is, the phase detection part 114 estimates the AC voltage waveform 141 (FIG. 5). According to the present example embodiment, by measuring an AC current at the distribution board, estimation of an AC voltage waveform at the distribution board without measuring an AC voltage, and analysis of a current waveform in synchronization with the AC voltage are made possible.

Figure 8:
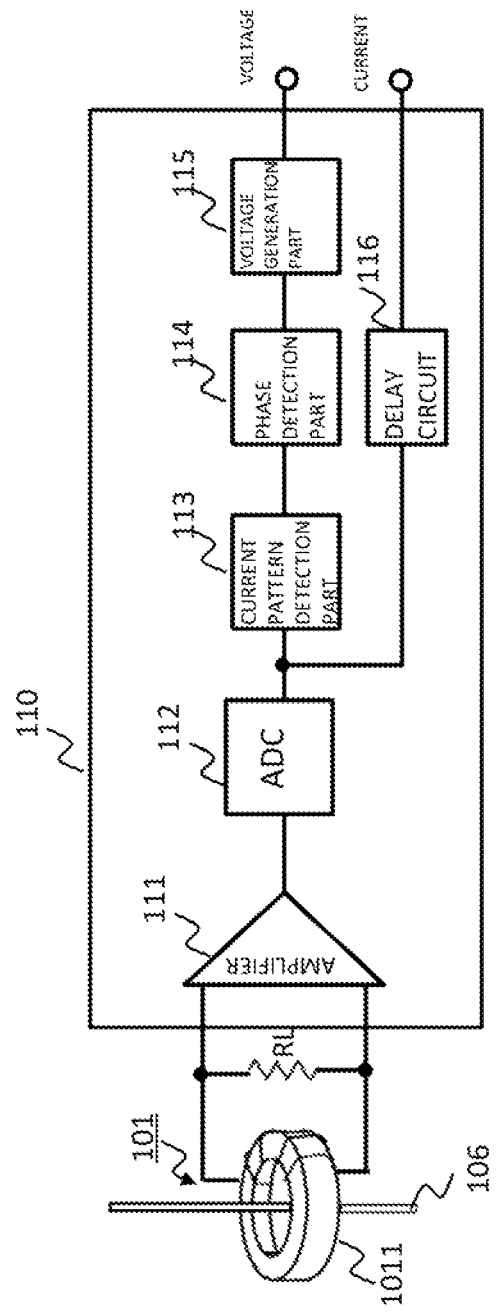
FIG. 8 is a diagram illustrating an example of a variation of a configuration of a measurement apparatus of the example embodiment 2 of the present invention.

FIG. 8 is a diagram illustrating an example of a variation of the example embodiment 2. In FIG. 8, in addition to a configuration of FIG. 7, a voltage generation part 115 which generates an AC voltage having a calculated phase difference is included. The voltage generation part 115 generates and outputs a voltage waveform (digital signal waveform) with a phase difference detected by the phase detection part 114 for a current waveform obtained by the ammeter 101. The voltage generation part 115 may generate an AC voltage waveform which maximize a power factor. A current waveform is outputted by delaying a digital signal from the ADC 112 at a delay circuit 116. The delay circuit 116 has a delay time corresponding to a processing delay of the current pattern detection part 113, the phase detection part 114 and the voltage generation part 115. The voltage generation part 115 may be configured to output a voltage converted to an analog signal by a digital-to-analog converter. In this case, a current waveform may be configured to be outputted from an output of the amplifier 111 through the delay circuit 116. According to the exemplary embodiment 2, the measurement apparatus 110 is configured as an apparatus of a battery driven type.

Figure 9:
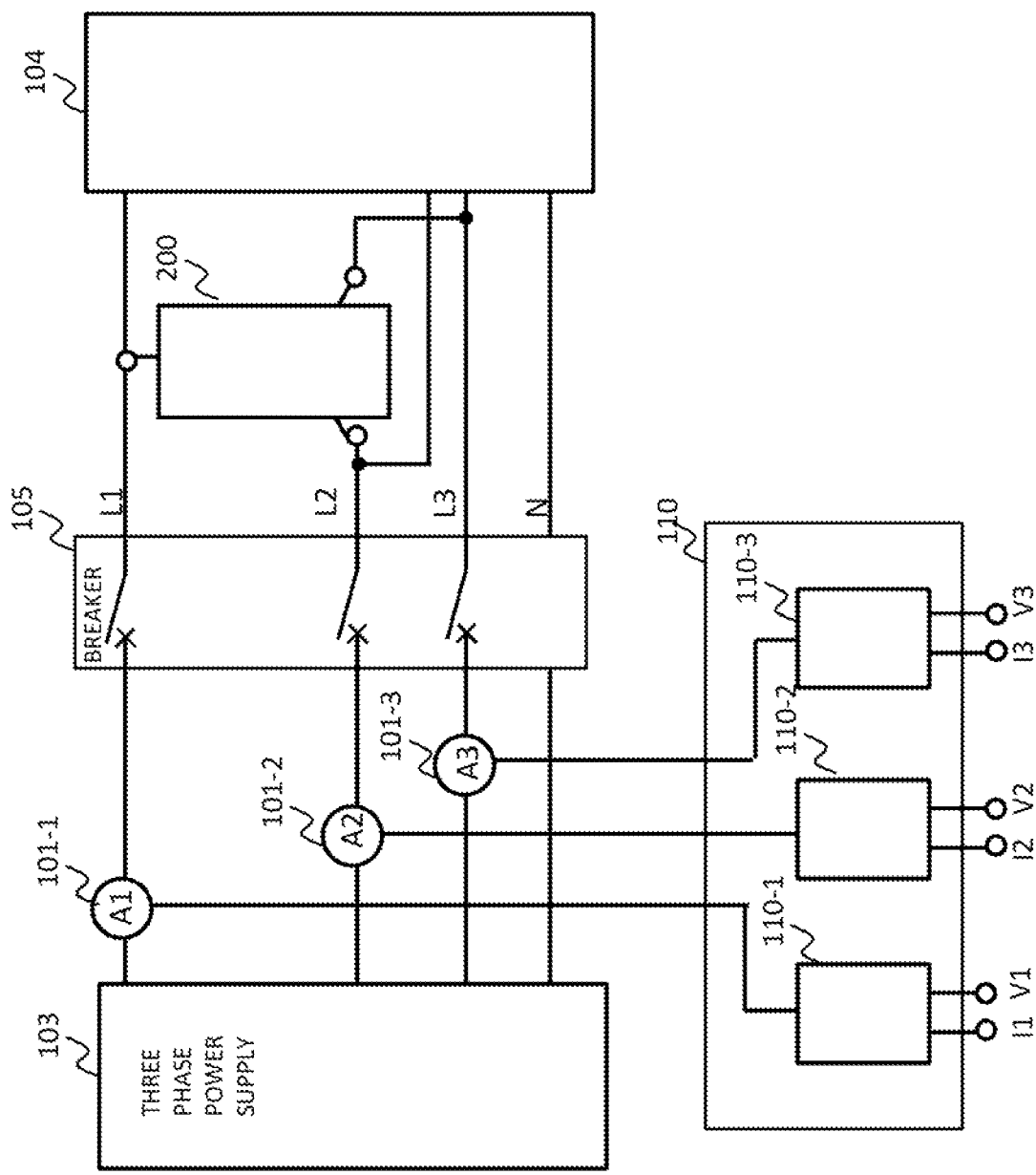
FIG. 9 is a diagram illustrating an example of an application to a three-phase four-wire system according to the example embodiment 2 of the present invention.

FIG. 9 is a diagram illustrating an example of a three-phase four-wire type current measurement system. In FIG. 9, non-contact type ammeters 101-1 to 101-3 are arranged respectively at power supply lines L1, L2 and L3 of the three phase power supply, and current waveforms Ii (i=1 to 3) and voltage waveforms Vi (i=1 to 3) in phase-synchronized with the current waveforms Ii are outputted from measurement apparatuses 110-1 to 110-3.

In FIG. 10, three phase current waveform Ii (i=1 to 3) outputted from the measurement apparatuses 110-1 to 110-3 and three phase voltage waveforms Vi (i=1 to 3) generated by the measurement apparatuses 110-1 to 110-3 are shown.

According to the present example embodiment, it becomes possible to analyze measured current waveforms without measuring AC voltages. According to the present example embodiment, it becomes possible to calculate (estimate) an AC voltage from a measured current waveform without measuring the AC voltage and perform current measurement at a timing in synchronization with the AC voltage.

Example Embodiment 3

An example embodiment 3 of the present invention will be described. A basic configuration is the same as that illustrated in FIG. 4A. In the example embodiment 2, the device 200 connected to the power outlet 107 is configured to output a predetermined current pattern at a timing in synchronization with a phase of a voltage. In the example embodiment 3, the device 200 connected to the power outlet 107 consumes a current in a predetermined pattern in synchronization with a current frequency. The device 200 may be an inverter and so on. Alternatively, the device 200 may be configured by a self-excited converter (inverter), an inductor element(s) and a capacitor element(s) and so on which do not consume reactive power. As with the example embodiment 2, in the example embodiment 3, regarding a current pattern of the device 200, the closer a power factor is to 0 (zero), the more a power consumption can be suppressed.

Figure 11:
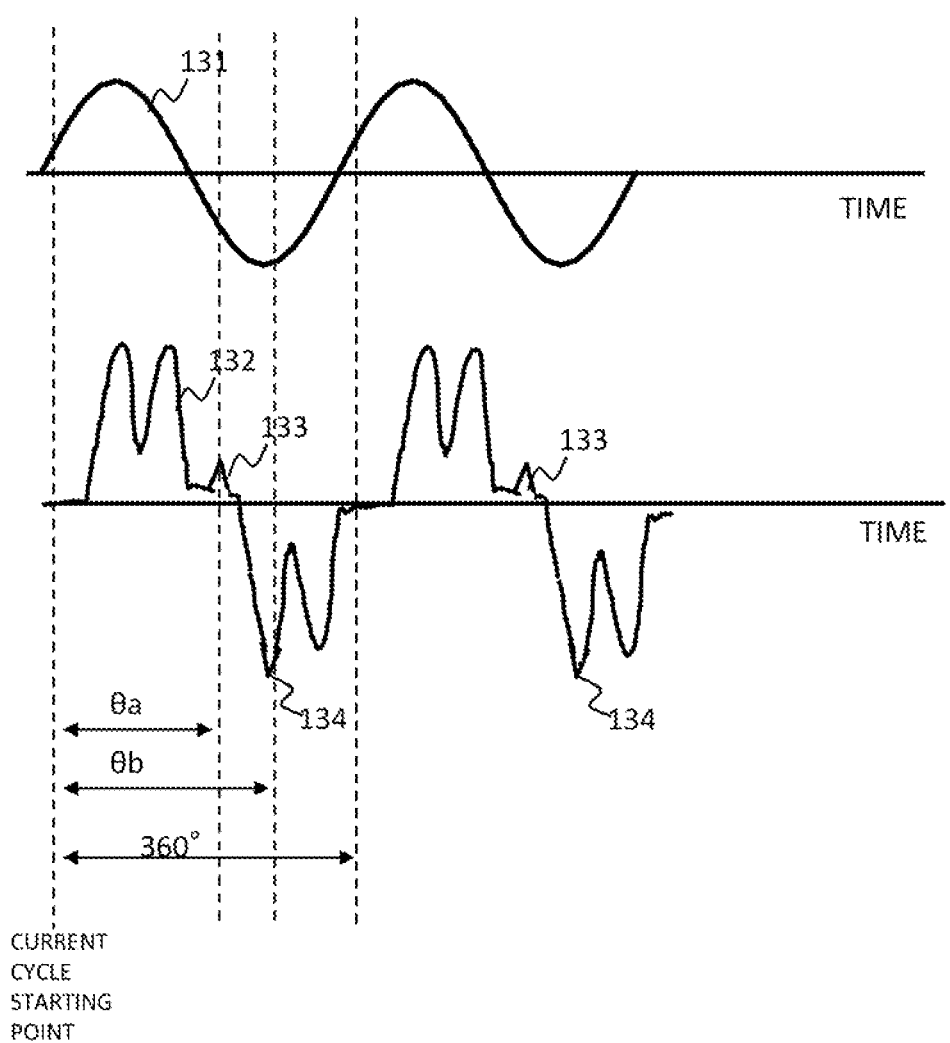
FIG. 11 is a diagram illustrating an example embodiment 3 of the present invention.
Figure 12:
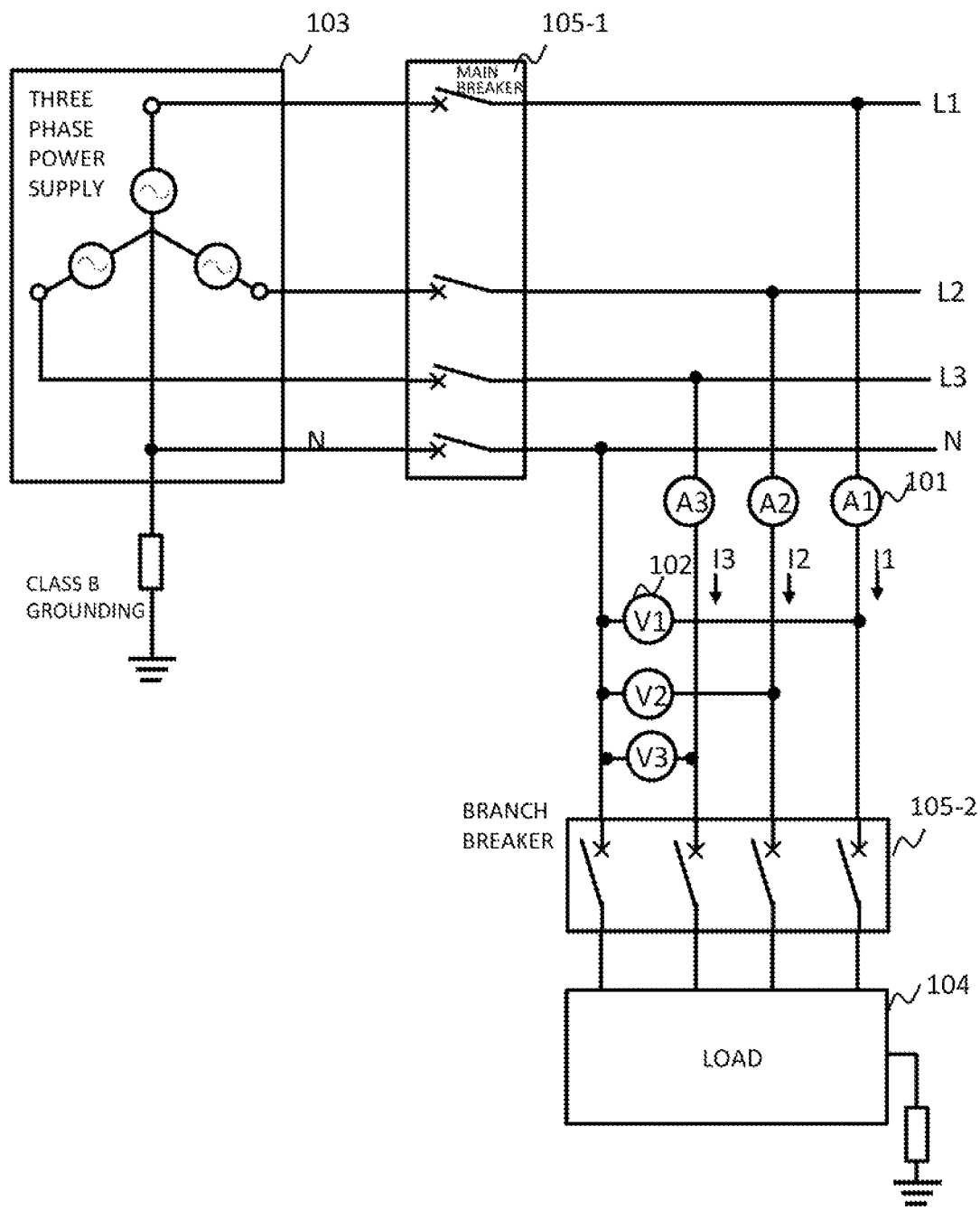
FIG. 12 is a diagram illustrating an example of a power measurement system.
Figure 13:
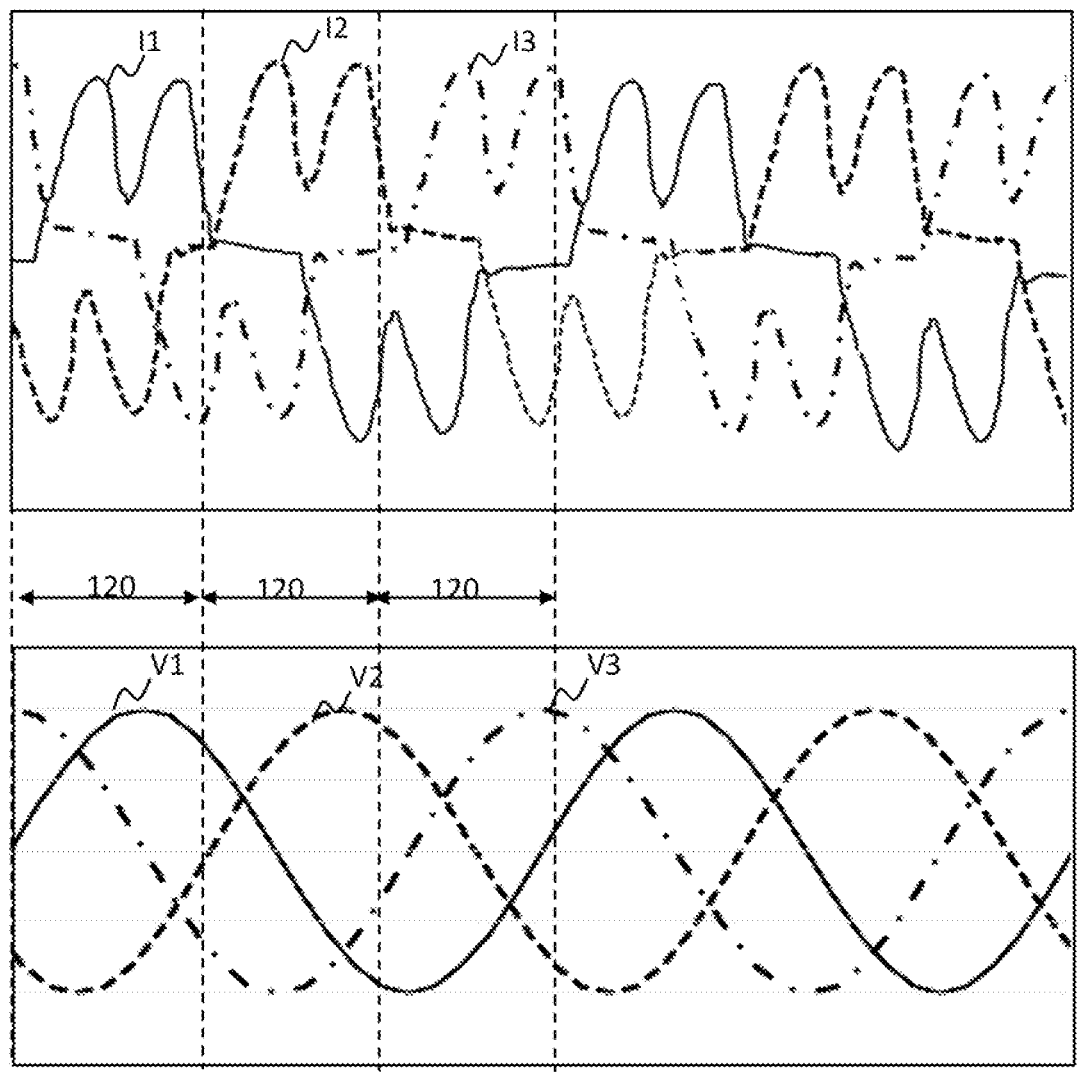
FIG. 13 is a diagram illustrating an example of a power measurement system.

FIG. 11 is a diagram illustrating an operation of the example embodiment 3. In FIG. 11, a waveform 131 is an AC voltage waveform at the distribution board. The waveform 132 is a current waveform measured by the ammeter 101. Reference signs 133 and 134 designate predetermined current patterns at the device 200 appearing in synchronization with a frequency of the current waveform. The current patterns 133 and 134 appear at phases θa and θb from a starting point of an AC current cycle and are superimposed on a consumption current of the load 104. Although a current waveform pattern consumed at a predetermined timing in synchronization with a current frequency by the device 200 is arbitrary such as a sine wave, a rectangular wave, a triangular wave, or the like, the current waveform pattern is preferably an isolated pattern which can be discriminated when superimposed on a consumption current of the load 104. A current pattern unique to the device 200 may have a configuration in which at least one pattern is arranged per cycle of the AC power supply period.

The measurement apparatus 110 detects current patterns 133 and 134 of the device 200 from a current waveform 132 at the distribution board measured by the ammeter 101.

The current patterns 133 and 134 unique to the device 200 are phase-synchronized with a current cycle and are periodic. Therefore, the current patterns 133 and 134 are also phase-synchronized with an AC voltage cycle. A starting point of an AC current cycle is calculated from the current pattern 133 (134), and the AC voltage waveform 131 at the distribution board (breaker 105) is estimated. It may be configured that an occurrence timing of a current pattern unique to the device 200 may be measured by a measurement apparatus (not illustrated) in advance and stored in a storage part of the measurement apparatus 110 not illustrated.

A basic configuration of the measurement apparatus 110 of the example embodiment 3 is the same as that of the example embodiment 2 as illustrated on FIG. 7. Referring to FIG. 7, in the measurement apparatus 110, the amplifier 111 performs voltage-amplification of a voltage (AC voltage) between terminals of the resistor RL, through which a current detected by the ammeter 101 flows. The ADC 112 converts a voltage from the amplifier 111 to a digital signal. The current pattern detection part 113 analyzes the digital signal from the ADC 112, detects current patterns 133 and 134 (it may be either one thereof) unique to the device 200 to obtain timing information thereof (phase information).

Occurrence timing information (delay, or phase information) at an AC current cycle of current patterns 133 and 134 is measured beforehand and stored in the measurement apparatus 110. The phase detection part 114 calculates a starting point of an AC current cycle, for example, based on occurrence(appearance) timing information (phase information) of the detected current pattern 133 (134) and estimates an AC voltage waveform at the distribution board which is not measured. In this case, an AC voltage may be generated in such a manner that a starting point of an AC current cycle is regarded as a starting point (zero crossing point) of an AC voltage cycle. Alternatively, with respect to an AC current waveform whose starting point of a cycle has been calculated, an AC voltage waveform maximizing a power factor may be calculated. The present example embodiment makes it possible to calculate (estimate) an AC voltage waveform at a distribution board without measuring a voltage and analyze a current waveform in synchronization with the voltage.

Furthermore, in the example embodiment 3, in the same way as FIG. 8, it may be configured to include a voltage generation part 115 which generates an AC voltage with a detected phase difference. The voltage generation part 115 may be configured to generate an AC voltage waveform which maximizes a power factor. In the example embodiment 3, the measurement apparatus 110 may be configured as an apparatus of a battery driven type.

The disclosure of the above Patent Literature 1 is incorporated herein by reference thereto. Variations and adjustments of the example embodiments and examples are possible within the scope of the overall disclosure (including the claims) of the present invention and based on the basic technical concept of the present invention. Various combinations and selections of various disclosed elements (including the elements in each of the claims, example embodiments, examples, drawings, etc.) are possible within the scope of the claims of the present invention. Namely, the present invention as a matter of course includes various variations and modifications that could be made by those skilled in the art according to the overall disclosure including the claims and the technical concept.

REFERENCE SIGNS LIST 101, 101-1 to 101-3 ammeter
102 voltmeter
103 power supply (AC power supply)
104 load
105 breaker
105-1 main breaker
105-2 branch breaker
106, 106-1, 106-2 power supply line
107 power outlet
110 measurement apparatus
111 amplifier
112 ADC
113 current pattern detection part
114 phase detection part
115 voltage generation part
116 delay circuit
117 FFT operation part
118 phase adjustment part
119 IFFT operation part
131, 141 voltage waveform (AC voltage waveform)
132, 142 current waveform (AC current waveform)
133, 134, 143, 144 current pattern
200 device
301 gain (gain)
302, 303 phase (phase)
1011 magnetic core

What is claimed is:

1. A measurement apparatus, comprising:
a memory; and
a processor in circuit communication with the memory, wherein the processor is configured to:
apply a Fourier Transform to a measured Alternating-Current (AC) current waveform to perform conversion thereof to a frequency domain;
adjust entire phase components of frequency spectra obtained as a result of the Fourier Transform, such that a phase component of an AC power supply frequency becomes zero; and
apply an inverse Fourier Transform to the frequency spectra with the entire phase components thereof adjusted to obtain an AC current waveform in a time domain.

2. The measurement apparatus according to claim 1, wherein the processor is configured to set a value obtained by subtracting the phase component of a frequency spectrum at the AC power supply frequency from a phase component of a frequency spectrum at each harmonic component of the AC power supply frequency, as the phase component of the frequency spectrum at the each harmonic component of the AC power supply frequency.

3. The measurement apparatus according to claim 1, wherein the processor is configured to receive the AC current waveform measured by an ammeter that measures a current at a distribution board.

4. The measurement apparatus according to claim 1, wherein the processor is configured to generate an AC voltage from the AC current waveform obtained as a result of the IFFT.

5. The measurement apparatus according to claim 1, wherein the processor is configured to generate the AC voltage to maximize a power factor from the AC current waveform obtained as a result of the inverse Fourier Transform.

6. A processor-implemented measurement method, comprising:
applying a Fourier Transform to an Alternating-Current (AC) current waveform measured to perform conversion thereof to a frequency domain;
adjusting entire phase components of frequency spectra obtained as a result of the Fourier Transform, such that a phase component of an AC power supply frequency becomes zero; and applying an inverse Fourier Transform to the frequency spectra with the entire phase components thereof adjusted to obtain an AC current waveform in a time domain.

7. The processor-implemented measurement method according to claim 6, comprising
setting a value obtained by subtracting the phase component of a frequency spectrum at the AC power supply frequency from a phase component of each frequency spectrum at harmonic components of the AC power supply frequency, as the phase component of the frequency spectrum at the each harmonic component of the AC power supply frequency.

8. The processor-implemented measurement method according to claim 6, comprising
receiving the AC current waveform measured by an ammeter that measures a current at a distribution board.

9. The processor-implemented measurement method according to claim 6, further comprising
generating an AC voltage from the AC current waveform obtained as a result of the inverse Fourier Transform.

10. The processor-implemented measurement method according to claim 6, further comprising
generating the AC voltage to maximize a power factor from the AC current waveform obtained as a result of the inverse Fourier Transform.

11. A non-transitory computer-readable medium storing thereon a program causing a processor to execute processing comprising:
applying a Fourier Transform to an Alternating-Current (AC) current waveform measured to perform conversion thereof to a frequency domain;
adjusting entire phase components of frequency spectra obtained as a result of the Fourier Transform, such that a phase component of an AC power supply frequency becomes zero; and
applying an inverse Fourier Transform to the frequency spectra with the entire phase components thereof adjusted to obtain a current waveform in a time domain.

12. The non-transitory computer-readable medium according to claim 11, wherein the adjusting entire phase components comprises
setting a value obtained by subtracting the phase component of a frequency spectrum at the AC power supply frequency from a phase component of each frequency spectrum at harmonic components of the AC power supply frequency, as the phase component of the frequency spectrum at the each harmonic component of the AC power supply frequency.

13. The non-transitory computer-readable medium according to claim 11, storing the program causing the processor to execute processing comprising
receiving the AC current waveform measured by an ammeter that measures a current at a distribution board.

14. The non-transitory computer-readable medium according to claim 11, storing the program causing the processor to execute processing comprising
generating an AC voltage from the AC current waveform obtained as a result of the IFFT.

15. The non-transitory computer-readable medium according to claim 11, storing the program causing the processor to execute processing comprising
generating the AC voltage to maximize a power factor from the AC current waveform obtained as a result of the IFFT.

* * * * *